United States Patent
Tanikawa et al.

(10) Patent No.: US 6,261,705 B1
(45) Date of Patent: Jul. 17, 2001

(54) POLY-SI FILM AND A SEMICONDUCTOR DEVICE WHEREIN THE POLY-SI FILM IS APPLIED

(75) Inventors: Akio Tanikawa; Hiroshi Okumura, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/089,518

(22) Filed: Jun. 3, 1998

(30) Foreign Application Priority Data

Jun. 4, 1997 (JP) .................................................... 9-146251
Mar. 2, 1998 (JP) .................................................. 10-049693

(51) Int. Cl.⁷ .................................................... B32B 15/00
(52) U.S. Cl. ........................ 428/641; 428/446; 428/448; 428/450
(58) Field of Search ..................................... 428/620, 636, 428/641, 446, 450, 448; 117/902; 257/64, 756

(56) References Cited

U.S. PATENT DOCUMENTS

| | | | |
|---|---|---|---|
| 5,147,820 | 9/1992 | Chittipeddi et al. | 438/592 |
| 5,153,702 * | 10/1992 | Aoyama et al. | 357/59 |
| 5,298,436 * | 3/1994 | Radosevich et al. | 437/29 |
| 5,381,032 | 1/1995 | Kokawa et al. | 257/412 |
| 5,652,156 | 7/1997 | Liao et al. | 438/161 |
| 5,707,882 * | 1/1998 | Hamada et al. | 437/21 |
| 5,786,027 * | 7/1998 | Rolfson | 427/124 |
| 5,863,659 * | 1/1999 | Kobayashi et al. | 428/446 |
| 6,069,388 * | 5/2000 | Okusa et al. | 257/347 |

FOREIGN PATENT DOCUMENTS

| | | |
|---|---|---|
| 0 798 770 | 10/1997 | (EP) . |
| 4-154170 | 5/1992 | (JP) . |
| 8-54360 | 2/1996 | (JP) . |

* cited by examiner

*Primary Examiner*—Deborah Jones
*Assistant Examiner*—Stephen Stein
(74) *Attorney, Agent, or Firm*—Young & Thompson

(57) ABSTRACT

To provide a poly-Si film which has excellence in its characteristics themselves concerning transistor characteristics, such as the diffusion and precipitation of dopant, the interface and surface state or the carrier mobility, and excellence in controllability of those characteristics as well, a poly-Si film grown on an amorphous layer (12) comprises; a base layer (131) interfacing with the amorphous layer (12) and having a preferred orientation rate comparatively high; a low-energy layer (133) grown at an upper side of the base layer (131) and having a preferred orientation rate which varies little and is lower than the preferred orientation rate of the base layer (131); and a surface layer (135) grown at the upper side of the low-energy layer (133) and having a preferred orientation rate which becomes higher towards a surface of the poly-Si film.

26 Claims, 6 Drawing Sheets

POLY-SI FILM AND A SEMICONDUCTOR DEVICE WHEREIN THE POLY-SI FILM IS APPLIED

BACKGROUND OF THE INVENTION

The present invention relates to a polycrystalline silicon thin film (hereafter simply called the poly-Si film) and a semiconductor device wherein the poly-Si film is applied.

A poly-Si film which is grown according to a conventional growth method, for example, grown by a low-pressure CVD (Chemical Vapor Deposition) system at a temperature of 700° C. with a silane gas of a flow rate of 800 sccm, has a layer structure wherein percentage of grains of a preferred orientation (110) increases monotonously towards the film surface, as can be seen in FIG. 8.

FIG. 8 is a cross section schematically illustrating a poly-Si film 83 grown on a $SiO_2$ surface oxidation layer 12 of a Si substrate 11 according to the conventional method. In FIG. 8, a numeral 831 denotes a base layer where the preferred orientation rate (110) is about 30%, a numeral 833 denotes a surface layer where the preferred orientation rate (110) is about 70%, and a numeral 832 denotes an intermediate layer where the preferred orientation rate (110) varies from about 30% to 70%. In the drawing, the base layer 831, the intermediate layer 832 and the surface layer 833 are bounded by dashed lines schematically. However, there is no distinct boundary between them actually, and the preferred orientation rate varies continuously traversing the layers, which is the same in other drawings when there is no other description.

A poly-Si film of another preferred orientation such as (111) or (100) obtained by the conventional growth method shows a similar layer structure, that is, a structure wherein the preferred orientation rate increases monotonously towards the film surface.

However, problem of excessive dopant diffusion into base material or insufficient activation of the poly-Si film itself becomes more serious with the poly-Si film having such layer structure, as it is made thinner and thinner along with miniaturization and high-performance of the semiconductor device whereto the poly-Si film is applied.

FIG. 9 is a cross section schematically illustrating a MOS (Metal Oxide Semiconductor) transistor, wherein a source electrode 95, a drain electrode 96, field oxidation films 93, a gate oxidation film 94, a gate electrode 97, Al (aluminum) wirings 98 and a passivation film 99 are configured on a n-type Si substrate 92.

When the poly-Si film having such layer structure is used for the gate electrode 97 without sufficient thickness, the dopant diffuses into the n-type Si substrate 92 penetrating the gate oxidation film 94, which causes a considerable variation of on/off characteristic of the MOS transistor and an operational delay because of unnecessary gate capacitance, both disabling to improve operational speed of the MOS transistor.

FIG. 10 is a cross section schematically illustrating a thin film transistor to be applied for driving an LCD (Liquid Crystal Display), for example, wherein an active layer 101 comprising a source electrode 102 and a drain electrode 103 is configured on a glass substrate 100, together with a gate electrode 104, Al wirings 105, a gate oxidation film 106 and a passivation film 107.

When the above conventional poly-Si is applied to the active layer 101, operational speed of the thin film transistor of FIG. 10 is also degraded because of small carrier mobility of the poly-Si film. Therefore, it can be said that the thin film transistor to be used for high-speed driver of the high quality LCD cannot be realized with the poly-Si film obtained according to the conventional growth method.

As above described, in the film transistor using the poly-Si film as its active layer, or in the MOS transistor using the poly-Si film as its gate electrode, characteristics of the poly-Si film, such as the diffusion and precipitation of dopant, the interface and surface state or the carrier mobility, which define characteristics of the transistor, becomes difficult to be controlled, when thickness of the poly-Si film is to be reduced according to reduction of the element size of the MOS transistor or the thin film transistor. In other words, performance improvement of the LCD or the IC is now being limited by electronic characteristics of the poly-Si film applied to the film transistor or the MOS transistor used therein.

Therefore, a primary object of the present invention is to provide a poly-Si film which has excellence in its characteristics themselves concerning transistor characteristics, such as the diffusion and precipitation of dopant, the interface and surface state or the carrier mobility, and excellence in controllability of those characteristics as well.

Another object of the invention is to provide high-quality semiconductor devices by applying this poly-Si film.

CONCEPTION OF THE INVENTION

Electronic characteristics of the poly-Si film depend deeply on surface, interface and grain boundaries of the poly-Si film. In these boundaries, carrier trap density becomes high. Especially among them, the grain boundary acts as a barrier to the carriers, degrading the carrier mobility. These boundaries also act as high-speed diffusion channels or precipitation channels of dopant, resulting in degradation of various characteristics.

Among the above boundaries, the grain boundary is most important to the electronic characteristics of the poly-Si film.

The grain orientation relates deeply to characteristics of the above surface, interface and grain boundaries. However, even when preferred orientation rate is simply reinforced, improvement of the carrier mobility and prevention of the high-speed diffusion or precipitation of P or B dopant cannot be realized at the same time.

As previously described, in the layer structure of the poly-Si film according to the conventional growth method, the preferred orientation rate and the grain size increase towards the film surface. The reason is as follows.

Growth speed of each crystal plane of a crystal grain differs and depends on growth condition such as the growth temperature or the flow rate of the material gas. In other words, a specific high-speed growth plane is determined by the growth condition. At the beginning of film growth process, among island-like fine grains generated on the amorphous base surface such as the oxidation film, island-like grains whereof the high-speed growth planes are facing upwards begin to grow prior to other island-like grains, and become more and more dominant by suppressing growth of grains having other orientations and uniting with grains having the same orientation.

In the conventional growth method of the poly-Si film, the same growth condition is maintained for determining an orientation, and consequently, the grain boundary energy becomes high as the film grows. For reducing the grain boundary energy, it is necessary to generate some plane defects, such as a coherent boundary between twin crystals where defect energy itself is low, for example, so as to disturb the crystal orientation. With such plane defects, the orientation characteristics of the poly-Si film can be changed, that is, the preferred orientation rate can be decreased or the preferred orientation axis itself can be alternated.

Many slits are generated arround the high-energy grain boundaries because of their distortion, resulting in the low carrier mobility, or transparency, and also in the high-speed diffusion or the precipitation of the dopant. With the low-energy grain boundaries, the situation is contrary. However, the problem cannot be resolved with a poly-Si film uniformly consisting of low-energy grain boundaries. Even is such poly-Si film can be realized, the dopant may not be injected sufficiently in the poly-Si film, or the injected dopant may be swept out to the base film.

As to the gate electrode of the MOS transistor, the dopant should be sufficiently injected until the gate bottom interfacing with the gate oxidation film, and, at the same time, the dopant diffusion into the gate oxidation film should be restricted within a low limit. Furthermore, dopant penetration into the active layer or the oxidation film because of the channelling effect at the ion injection should be prevented. Still farther, sharp variation of the dopant density must be also avoided to minimize the parasitic capacitance.

Therefore, for improving performance of the MOS transistor, it is necessary that the poly-Si film to be applied to gate electrode thereof has;
 a high-energy layer interfacing with the basic oxidation film, said high-energy layer comprising high-energy grain boundaries, that is, showing a comparatively high preferred orientation rate, so as to have a dopant gettering effect, and
 a low-energy layer grown on the high-energy layer, said low-energy layer comprising low-energy grain boundaries, that is, showing a comparatively low preferred orientation rate, so as to prevent excessive diffusion of the dopant.

It is also necessary that preferred orientation rate varies gradually traversing the high-energy layer and the low-energy layer.

It is preferably for the poly-Si film to be applied to the gate electrode that is it has a different orientation layer further grown on the low-energy layer so as to prevent the channelling effect at the ion injection, and it is still preferably that the poly-Si has a repetition of the above high-energy layer, the low-energy layer and the different orientation layer.

On the other hand, to be used for the active layer of the thin film transistor of the LCD, a high carrier mobility is required for the poly-Si film grown on the glass substrate. When the gate electrode is to be formed on the surface of the poly-Si film, it is preferable for improving the carrier mobility that there exists a low-energy layer showing small preferred orientation rate on the surface.

Grain orientation near the interface between the glass substrate and the poly-Si film is determined by the interface energy and the grain surface energy. Hence, when the poly-Si film is grown according to the conventional method, the preferred orientation rate becomes higher and higher towards the film surface and the high grain boundary energy is generated at the surface, resulting in degradation of the carrier mobility.

Therefore, it is preferable for the poly-Si film to be applied to the active layer of the thin film transistor that the preferred orientation rate, or the grain boundary energy is made decreased towards the surface of the poly-Si film.

SUMMARY OF THE INVENTION

Based on the above conception studied by us, a poly-Si film of the invention grown on an amorphous layer comprises;
 a base layer interfacing with the amorphous layer and having a preferred orientation rate comparatively high;
 a low-energy layer grown at an upper side of the base layer and having a preferred orientation rate which varies little and is lower than the preferred orientation rate of the base layer; and
 a surface layer grown at the upper side of the low-energy layer and having a preferred orientation rate which becomes higher towards a surface of the poly-Si film.

Another poly-Si film of the invention grown on an amorphous layer comprises;
 a base layer interfacing with the amorphous layer and having a preferred orientation rate comparatively high;
 a low-energy layer grown at an upper side of the base layer and having a preferred orientation rate which varies little and is lower than the preferred orientation rate of the base layer; and
 a surface layer grown at the upper side side of the low-energy layer and having different preferred orientation from preferred orientation of the base layer and the low-energy layer, a rate of said different preferred orientation becoming higher towards a surface of the poly-Si film.

Another poly-Si film of the invention grown on an amorphous layer comprises;
 a base layer interfacing with the amorphous layer and having a preferred orientation rate comparatively high; and
 a low-energy layer grown at an upper side of the base layer attaining to a surface of the poly-Si film and having a preferred orientation rate which varies little and is lower than the preferred orientation rate of the base layer.

Another poly-Si film of the invention grown on an amorphous layer comprises;
 a base layer interfacing with the amorphous layer and having a preferred orientation rate comparatively high; and
 a low-energy layer grown at an upper side of the base layer attaining to a surface of the poly-Si film and having different preferred orientation from preferred orientation of the base layer, a rate of said different preferred orientation varying little.

Another poly-Si film of the invention grown on an amorphous layer comprises a layer structure wherein;
 a high-energy layer having a preferred orientation rate comparatively high, and a low-energy layer having a preferred orientation rate comparatively law are ranged alternately towards a surface of the poly-Si film.

Another poly-Si film of the invention grown on an amorphous layer comprises a layer structure wherein;
 a first orientation layer having first preferred orientation, and a second orientation layer having second preferred orientation different from the first preferred orientation are ranged alternately towards a surface of the poly-Si film.

Still another poly-Si film of the invention grown on an amorphous layer comprises;

a base layer interfacing with the amorphous layer and having a preferred orientation rate comparatively high; and a low-energy layer grown on the base layer attaining to a surface of the poly-Si film and having a preferred orientation rate which becomes lower towards a surface of the poly-Si film.

Thickness of these poly-Si films as above described is preferably within 300 nm.

In a semiconductor device of the invention, one of the poly-Si films as above described is applied to an electrode of the semiconductor device.

In another semiconductor device of the invention, one of the poly-Si films as above described is applied to an active layer of the semiconductor device.

Therefore, the poly-Si films of the invention have excellence in its characteristics themselves concerning transistor characteristics, such as the diffusion and precipitation of dopant, the interface and surface state or the carrier mobility, and excellence in controllability of those characteristics as well.

Further, high-quality semiconductor devices can be realized by applying these poly-Si films thereto.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

At the beginning of the description, definition of the preferred orientation rate is described. Here, in this specification, the preferred orientation and its rate are represented by a dominant orientation <hkl> of crystal axes of the grains perpendicular to the film surface and volume percentage of the grains having the dominant orientation, respectively. Suppose a poly-Si film having grains whereof 30% have crystal axes <111> towards the film surface, 20% have <110>, 15% have <100>, 15% have <211>, 10% have <311> and 10% have <331>, for example. The preferred orientation and its rate of such poly-Si film is defined to be (111) and 30%, respectively, and hereafter expressed as 30%=(111).

These orientation rates can be measured with an ordinary X-ray diffract meter, when the film thickness is comparatively thick. When the film thickness is very thin, the orientation rates can be measured by observing electron diffraction with an electron micrometer or by making use of an X-ray diffraction measurement system disclosed in a Japanese patent application laid open as a Provisional Publication No. 53460/'96, for example.

Now, embodiments of the present invention will be described in connection with the drawings.

Figure 1:
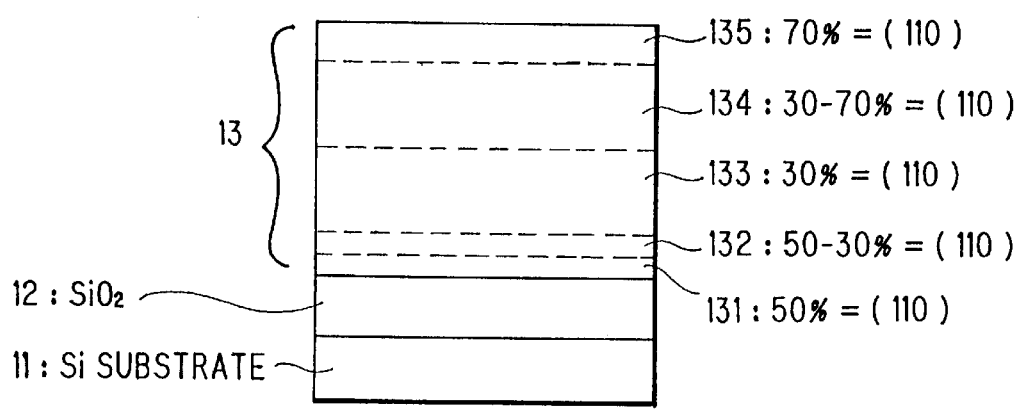
FIG. 1 is a cross section schematically illustrating a poly-Si film 13 according to a first embodiment of the invention.

FIG. 1 is a cross section schematically illustrating a poly-Si film 13 according to a first embodiment of the invention, which is grown on an oxidation ($SiO_2$) film 12 of a Si substrate 11.

Referring to FIG. 1, the poly-Si film 13 of the first embodiment comprises a low-energy layer 133 of 30%=(110) in the middle of the film, which has the same preferred orientation with a base layer 131 of 50%=(110) and a surface layer 135 of 70%=(110), but the preferred orientation rate is weekend to about 30% here.

Between the base layer 131 and the low-energy layer 133, there is sandwiched an intermediate layer 132 where the preferred orientation rate varies gradually from 50%=(110) to 30%=(110). In the same way, another intermediate layer 134 is sandwiched between the low-energy layer 133 and the surface layer 135 where the preferred orientation rate varies gradually from 30%=(110) to 70%=(110).

In FIGS. 1 to 8, each even numeral of triple figures denotes an intermediate layer wherein the preferred orientation rate or the preferred orientation itself varies gradually between two layers (denoted by odd numerals) sandwiching the intermediate layer, and duplicated description will be omitted. Further, each layer is bounded by a dashed line, in the drawings, However, the preferred orientation rate varies continuously traversing the layers, as previously described.

Figure 9:
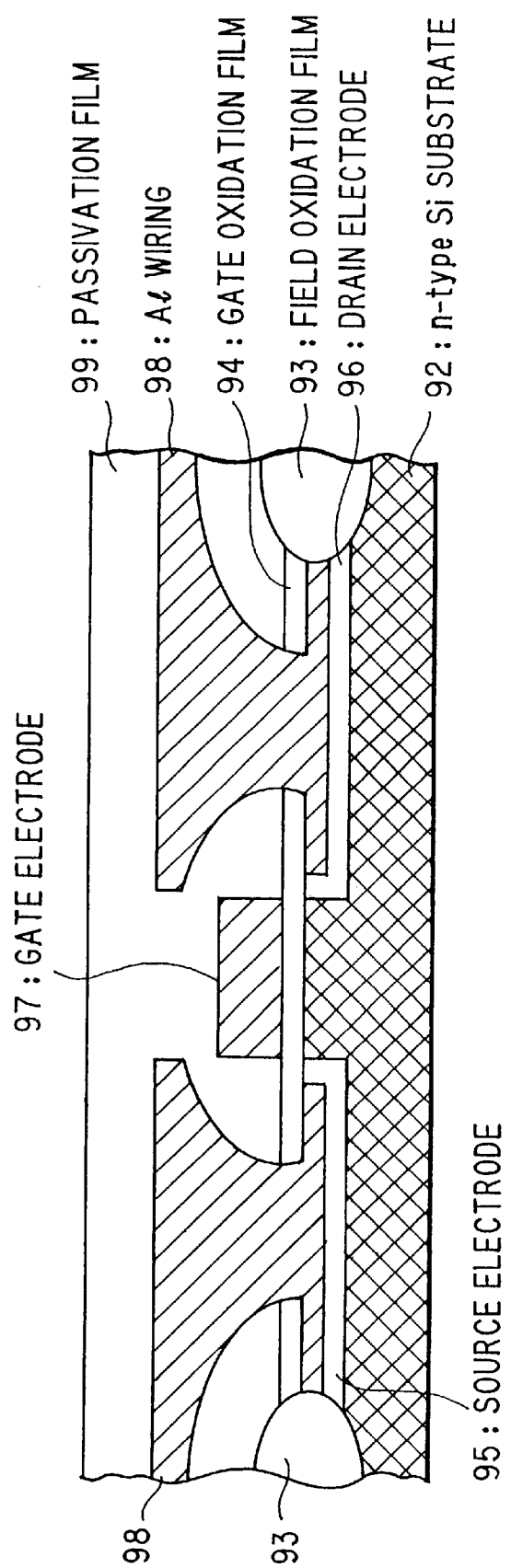
FIG. 9 is a cross section schematically illustrating configuration of a MOS transistor.

When the gate electrode 97 of the MOS transistor of FIG. 9 is configured with the poly-Si film 13 of FIG. 1, the dopant can be controlled to diffuse sufficiently until just above the gate oxidation film 94, restricting, at the same time, the dopant penetrating into the oxidation film 94 within a low level. Furthermore, the low-energy layer 133 of 30%=(110) shows a gettering effect for trapping impurity atoms rarely remaining in the gate oxidation film 94.

Therefore, a high-quality gate element (the gate electrode 97 and the gate oxidation film 94) of the MOS transistor or the LSI can be obtained with the poly-Si film 13 of the first embodiment.

The poly-Si film 13 of FIG. 1 can be grown by way of a low-pressure CVD system as follows.

The residual oxygen pressure is set about $10^{-3}$ to $10^{-1}$ Torr initially. The film growth is performed at a growth temperature of 605° to 630° C. with silane gas of a flow rate 685 sccm, until the poly-Si film is grown more than 100 nm in thickness. Then, a heat treatment of 700° to 800° C. is performed at least 20 seconds.

Optimization of the above growth conditions may be necessary in accordance with the growth system. However, a poly-Si film having a similar layer structure of different preferred orientation other than (110) may be obtained by controlling the growth temperature in the film growth process, for example.

Figure 2:
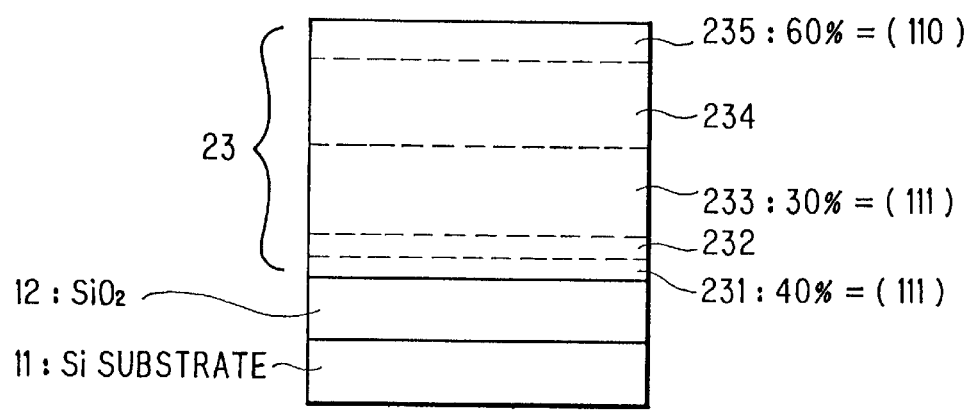
FIG. 2 is a cross section schematically illustrating a poly-Si film 23 according to a second embodiment of the invention.

FIG. 2 is a cross section schematically illustrating a poly-Si film 23 according to a second embodiment of the invention, comprising a base layer 231 of 40%=(111), a low-energy layer 233 of 30%=(111) in the middle of the film and a surface layer 235 of 60%=(110) having a different preferred orientation (110) with the preferred orientation (111) of the low-energy layer 233 and the base layer 231.

The poly-Si film 23 of the second embodiment shows the same effect with the poly-Si film 13 of the first embodiment.

The poly-Si film 23 of the second embodiment can be obtained by performing the film growth in the low-pressure CVD system with an initial residual oxygen pressure of under $10^{-3}$ Torr, at a growth temperature of 560° to 580° C. with silane gas of a flow rate 300 to 400 sccm, for example.

Figure 3:
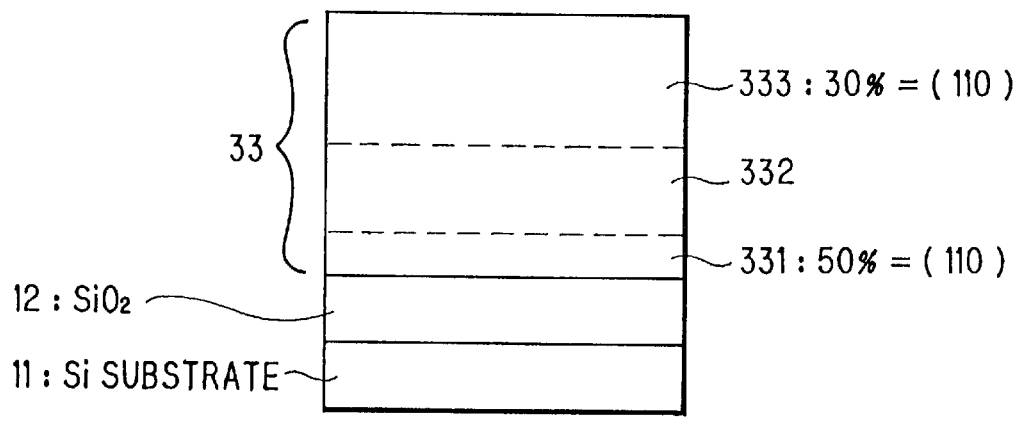
FIG. 3 is a cross section schematically illustrating a poly-Si film 33 according to a third embodiment of the invention.

FIG. 3 is a cross section schematically illustrating a poly-Si film 33 according to a third embodiment of the invention, comprising a base layer 331 of 50%=(110) and a low-energy layer 333 of 30%=(110) grown at the film surface. The preferred orientation rate is weakened towards the film surface maintaining the same preferred orientation.

The poly-Si film 33 of the third embodiment can be obtained by ending the film growth, which is performed on the same condition with the first embodiment, before the film thickness attains to 100 nm, or by beginning the film growth at a growth temperature of 540° C. and continuing the film growth until the film thickness attains 150 nm by raising the growth temperature gradually.

The poly-Si film 33 of the third embodiment gives the same effect with the poly-Si film 13 of the first embodiment. Furthermore, the poly-Si film 33 of the third embodiment can be configured thinner than the poly-Si film 13 of the first embodiment. Therefore, by applying the poly-Si film 33 to the gate electrode 97 of the MOS transistor of FIG. 9, for example, still further miniaturization of the MOS transistor can be realized, enabling to provide still higher integrated LSI.

Figure 4:
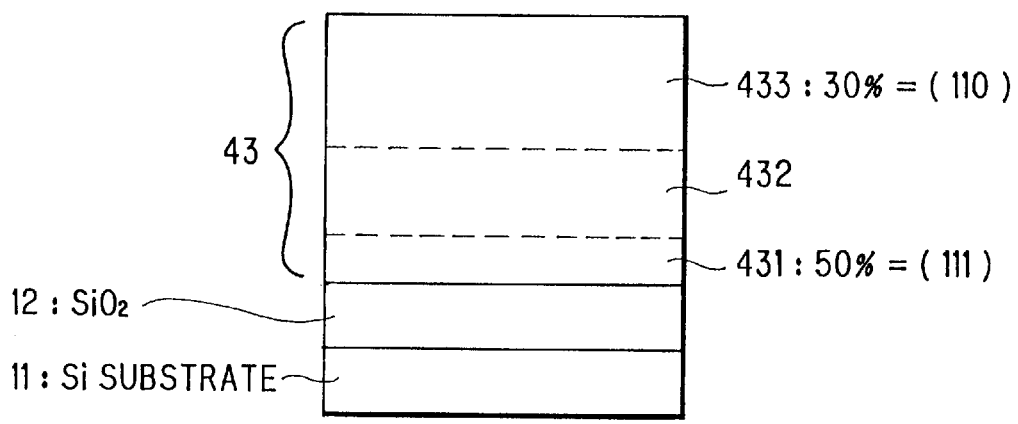
FIG. 4 is a cross section schematically illustrating a poly-Si film 43 according to a fourth embodiment of the invention.

FIG. 4 is a cross section schematically illustrating a poly-Si film 43 according to a fourth embodiment of the invention, comprising a base layer 431 of 50%=(111) and a low-energy layer 433 of 30%=(110) grown at the film surface. The preferred orientation is gradually changed and the preferred orientation rate is weakened towards the film surface.

The poly-Si film 43 of the fourth embodiment can be obtained, for example, by beginning the film growth at a growth temperature of 540° C., then raising the growth temperature sharply and maintaining the high growth temperature until ending the film growth when the film thickness attains to 200 nm.

Similarly to the third embodiment, the poly-Si film 43 of the fourth embodiment gives the same effect as the poly-Si film 13 with thinner film thickness. Therefore, when applied to the gate electrode 97 of the MOS transistor of FIG. 9, for example, still further miniaturization of the MOS transistor can be realized, enabling to provide still higher integrated LSI with the poly-Si film 43 of the fourth embodiment than the poly-Si film 13 of the first embodiment.

Figure 5:
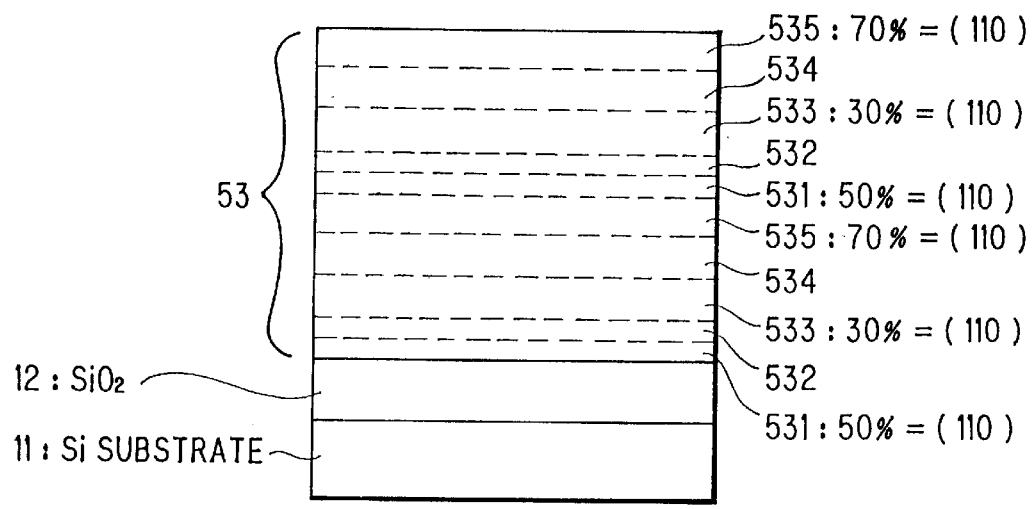
FIG. 5 is a cross section schematically illustrating a poly-Si film 53 according to a fifth embodiment of the invention.

FIG. 5 is a cross section schematically illustrating a poly-Si film 53 according to a fifth embodiment of the invention.

The poly-Si film 53 of FIG. 5 comprises a repetition of a layer structure having a base layer 531 of 50%=(110), a low-energy layer 533 of 30%=(110) grown on the base layer 531 and a high-energy layer 535 of 70%=(110) grown on the low-energy layer 533. This layer structure is repeated two times here, in the example of FIG. 5.

The poly-Si film 53 of the fifth embodiment can be obtained with a low-pressure CVD growth by repeating a sharp up/down of the growth temperature in a range comparatively high, for example, so that the preferred orientation (111) may not be generated.

The poly-Si film 53 of the fifth embodiment shows a high prevention effect against the ion-channelling. Therefore, by applying to the gate electrode 97 of FIG. 9, for example, a highly stable performance of the MOS transistor can be obtained.

Figure 6:
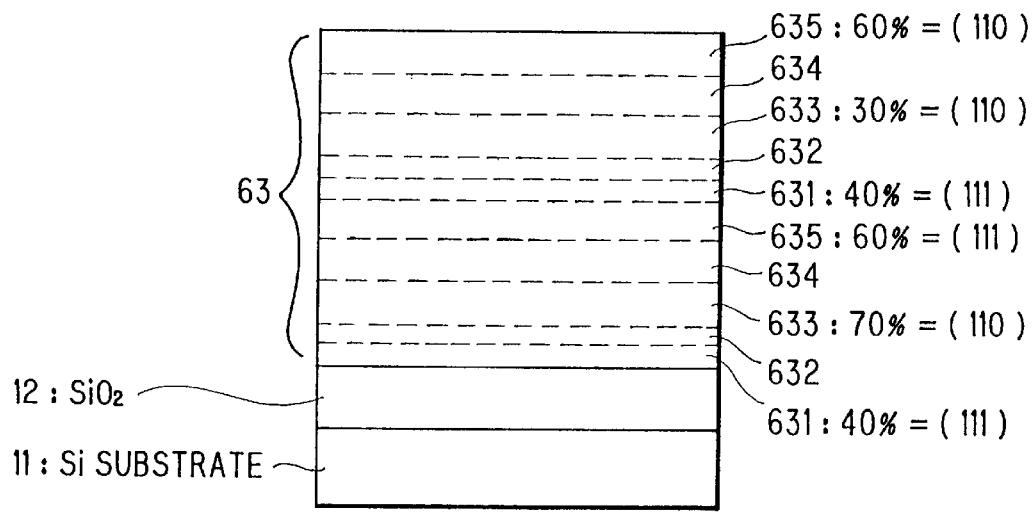
FIG. 6 is a cross section schematically illustrating a poly-Si film 63 according to a sixth embodiment of the invention.

FIG. 6 is a cross section schematically illustrating a poly-Si film 63 according to a sixth embodiment of the invention.

Similarly to the fifth embodiment, the poly-Si film 63 of FIG. 6 comprises a repetition of a base layer 631 of 40%=(111), an anisotropic layer 633 of 70%=(110) grown on the base layer 631 and a high-energy layer 635 of 60%=(111) grown on the anisotropic layer 633.

The poly-Si film 63 of the sixth embodiment can be obtained with a low-pressure CVD growth by repeating a sharp up/down of the growth temperature in a range comparatively low, for example, so that the preferred orientations (111) and (110) may be alternately generated.

The poly-Si film 63 of the sixth embodiment also shows a high prevention effect against the ion-channelling. Therefore, by applying to the gate electrode 97 of FIG. 9, for example, a highly stable performance of the MOS transistor can be obtained, in the same way with the poly-Si film 53 of the fifth embodiment.

Now, a poly-Si film 72 according to a seventh embodiment grown on a glass substrate 71 will be described referring to FIG. 7.

Figure 7:
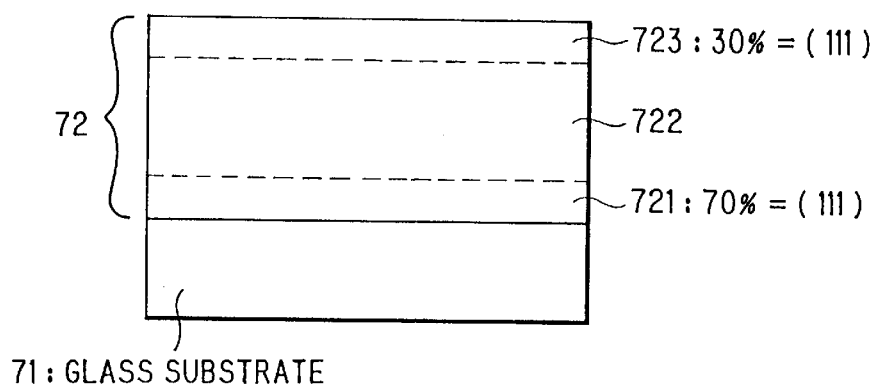
FIG. 7 is a cross section schematically illustrating the poly-Si film 72 according to a seventh embodiment of the invention.
Figure 8:
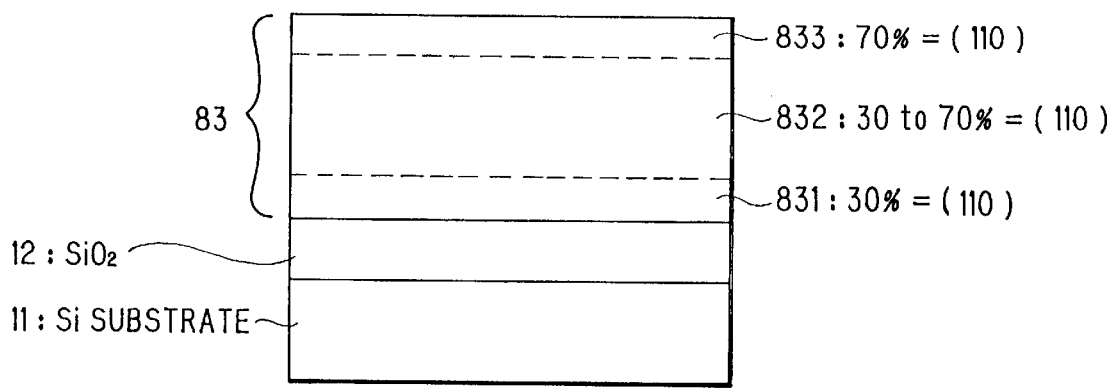
FIG. 8 is a cross section schematically illustrating a poly-Si film 83 according to a conventional growth method.

FIG. 7 is a cross section schematically illustrating the poly-Si film 72 of the seventh embodiment, having such a layer structure that a base layer 721 of 70%=(111) is grown on the glass substrate 71 and the preferred orientation rate is lowered towards the film surface where a low-energy layer 723 of 30%=(111) is configured.

The poly-Si film 72 of the seventh embodiment can be obtained as follows.

An amorphous silicon film (hereafter described as the a-Si film) of a thickness of 85 nm is firstly grown on the glass substrate 71 by a low-pressure CVD system with an initial residual oxygen pressure of $10^{-3}$ to $10^{-1}$ Torr. Then, the a-Si film is crystallized by annealing making use of a XeCl excimer laser on such a condition that the melting of the a-Si film attains to more than half of its film thickness, leaving solid state Si near the interface between the glass substrate 71 and the a-Si film, at the same time.

The poly-Si film 72 can be also obtained as follows.

Beginning the film growth by the low-pressure CVD system with the growth condition for the a-Si film, the growth temperature is raised gradually so that the growth of the a-Si film and its crystallization are performed in parallel.

Figure 10:
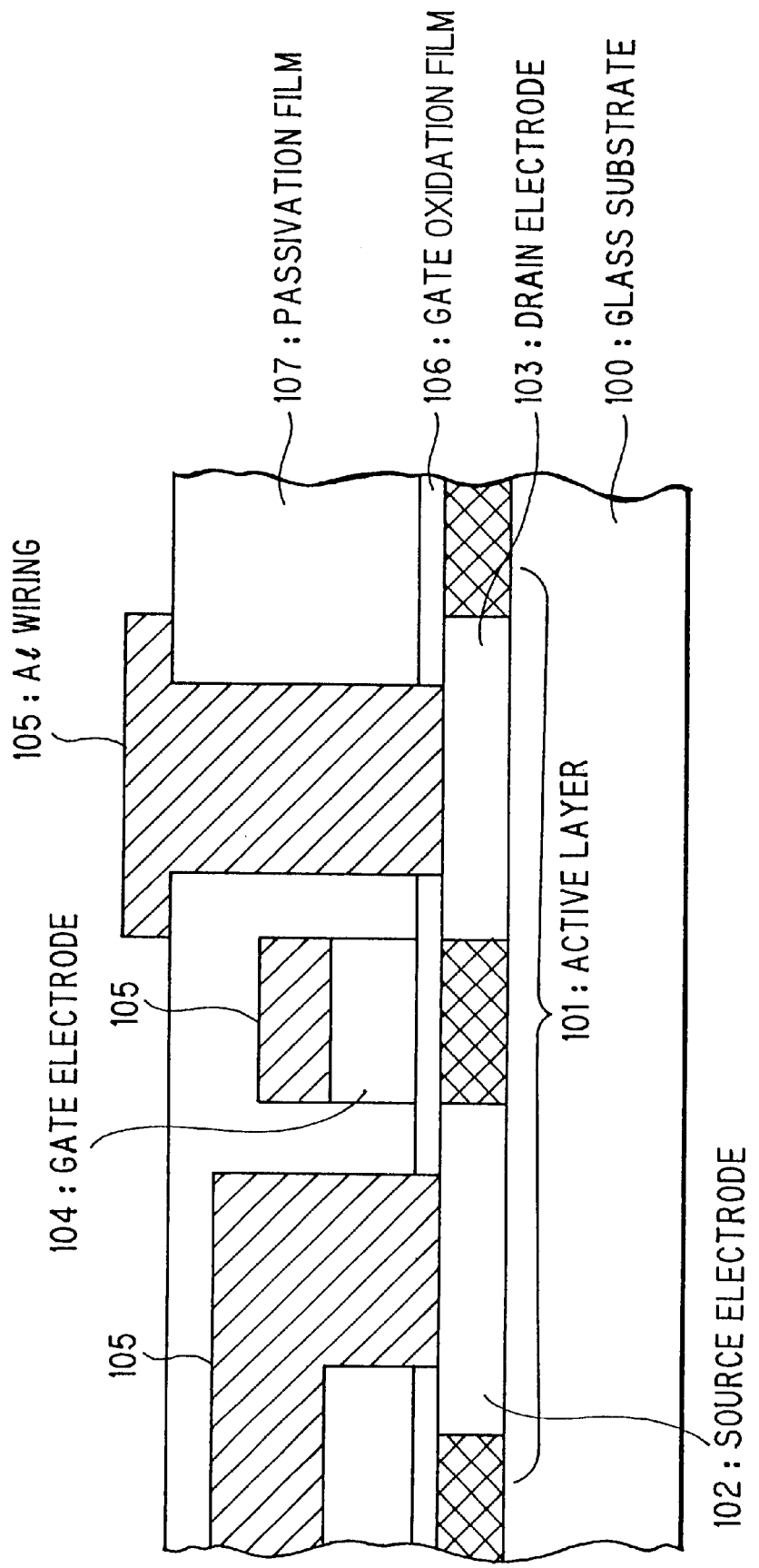
FIG. 10 is a cross section schematically illustrating configuration of a thin film transistor.

When the poly-Si film 72 of the seventh embodiment is applied to the active layer 101 of the film transistor of FIG. 10, excessive diffusion of the dopant towards the film base is restricted and a high dopant density is obtained near the film surface. Consequently, a sharp lateral gradient of the dopant density can be realized both at the source electrode 102 and the drain electrode 103, preventing penetration as well of impurity atoms to the active layer 101 from the glass substrate 100.

Heretofore, embodiments of the invention are described in connection with examples of the poly-Si films illustrated in the drawings. However, the scope of the invention is not limited in these examples. For example, the preferred orientation rates may be the same as described. Important characteristics of the invention lie in the order and the inclination of the preferred orientation rate (medium, small or large) in the direction perpendicular to the film surface.

By applying the poly-Si films of about 150 nm grown according to the first to the sixth embodiment to the gate electrodes 97 of MOS transistors of FIG. 10 whereof other components are fabricated according to appropriate conventional methods (such as heat oxidation, photolithography, dry-etching, CVD, spattering, etc.), the dispersion of transistor characteristics can be reduced within 1/10 of that of MOS transistors wherein conventional poly-Si films of the same thickness are applied to the gate electrodes 97.

And, by applying the poly-Si films grown according to the seventh embodiment to the active layers 101 of thin film transistors of FIG. 10 whereof other components are fabricated according to appropriate conventional methods (such as heat oxidation, photolithography, dry-etching, CVD, spattering, etc.), ten times higher carrier mobility and consequently, ten times higher operational speed can be obtained than those of thin film transistors wherein conventional poly-Si films are applied to the active layers 97, and high-quality and high-precision LCDs can be realized by applying the thin film transistors making use of the poly-Si film of the invention to their drivers.

As heretofore described, there can be realized a poly-Si film which has excellence in its characteristics themselves concerning transistor characteristics, such as the diffusion and precipitation of dopant, the interface and surface state or the carrier mobility, and has as well a wide controllability of those characteristics, according to the invention.

What is claimed is:

1. A polycrystalline silicon film grown on an amorphous layer, said polycrystalline silicon film comprising:
    a base layer interfacing with the amorphous layer and having a first preferred orientation rate;
    a low-energy layer grown at an upper side of the base layer and having a preferred orientation rate which is lower than the first preferred orientation rate; and
    a surface layer grown at an upper side of the low-energy layer and having a preferred orientation rate which is greater than the first preferred orientation rate.

2. A polycrystalline silicon film as recited in claim 1, thickness of said polycrystalline silicon film being within 300 nm.

3. A semiconductor device wherein a polycrystalline silicon film as recited in claim 1 is applied to an electrode of the semiconductor device.

4. A semiconductor device wherein a polycrystalline silicon film as recited in claim 1 is applied to an active layer of the semiconductor device.

5. The polycrystalline silicon film of claim 1, wherein the first preferred orientation rate does not exceed 50%.

6. The polycrystalline silicon film of claim 5, wherein the preferred orientation rate of the base layer exceeds the preferred orientation rate of the low-energy layer by at least 20%.

7. The polycrystalline silicon film of claim 6, wherein the preferred orientation rate of the surface layer exceeds the preferred orientation rate of the base layer by at least 20%.

8. The polycrystalline silicon film of claim 1, wherein the base, low-energy, and surface layers share a single preferred orientation.

9. The polycrystalline silicon film of claim 8, wherein the single preferred orientation is <110>.

10. The polycrystalline silicon film of claim 8, wherein the first preferred orientation rate does not exceed 50%.

11. The polycrystalline silicon film of claim 10, wherein the preferred orientation rate of the base layer exceeds the preferred orientation rate of the low-energy layer by at least 20%.

12. The polycrystalline silicon film of claim 11, wherein the preferred orientation rate of the surface layer exceeds the preferred orientation rate of the base layer by at least 20%.

13. The polycrystalline silicon film of claim 1, wherein the preferred orientation rates of the base, low-energy, and surface layers vary continuously traversing said layers.

14. A polycrystalline silicon film grown on an amorphous layer, said polycrystalline silicon film comprising:
    a base layer interfacing with the amorphous layer and having a first preferred orientation rate;
    a low-energy layer grown at an upper side of the base layer and having a preferred orientation rate which is lower than the first preferred orientation rate; and
    a surface layer grown at an upper side of the low-energy layer and having a different preferred orientation from the preferred orientation of the base layer and the preferred orientation rate of the low-energy layer, the surface layer having a preferred orientation rate which is greater than the first preferred orientation rate.

15. The polycrystalline silicon film of claim 14, wherein the preferred orientation rate of the base layer and the low-energy layer is <111>.

16. The polycrystalline silicon film of claim 15, wherein the preferred orientation rate of the surface layer is <110>.

17. The polycrystalline silicon film of claim 14, wherein the first preferred orientation rate does not exceed 40%.

18. The polycrystalline silicon film of claim 17, wherein the preferred orientation rate of the base layer exceeds the preferred orientation rate of the low-energy layer by at least 10%.

19. The polycrystalline silicon film of claim 18, wherein the preferred orientation rate of the surface layer exceeds the preferred orientation rate of the base layer by at least 20%.

20. The polycrystalline silicon film of claim 14, wherein the preferred orientation rates of the base, low-energy, and surface layers vary continuously traversing said layers.

21. A polycrystalline silicon film grown on an amorphous layer, comprising:
    at least two pairs of layers, each said pair comprising:
    a first orientation layer having a first preferred orientation, and
    a second orientation layer having a second preferred orientation different from the first preferred orientation;
    wherein the layers are arranged to alternate between the first and second preferred orientations; and
    wherein a preferred orientation rate of the second orientation layer most distant from the amorphous layer is greater than a preferred orientation rate of the first orientation layer nearest the amorphous layer.

22. The polycrystalline silicon film of claim 21, wherein the first preferred orientation is <111>.

23. The polycrystalline silicon film of claim 22, wherein the second preferred orientation is <110>.

24. The polycrystalline silicon film of claim 21, wherein a rate of the first preferred orientation in the layer nearest the amorphous layer is no greater than 40%.

25. The polycrystalline silicon film of claim 21, wherein there are only two said pairs of layers.

26. The polycrystalline silicon film of claim 21, wherein the preferred orientation rates of the first orientation layers and the second orientation layers vary continuously traversing said layers.

* * * * *